United States Patent
Xu et al.

(10) Patent No.: US 12,020,976 B2
(45) Date of Patent: Jun. 25, 2024

(54) SUBSTRATE PROCESSING APPARATUS AND METHOD FOR REMOVING SUBSTRATE FROM TABLE OF SUBSTRATE PROCESSING APPARATUS

(71) Applicant: EBARA CORPORATION, Tokyo (JP)

(72) Inventors: Haiyang Xu, Tokyo (JP); Koji Maeda, Tokyo (JP); Mitsuhiko Inaba, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 78 days.

(21) Appl. No.: 17/212,842

(22) Filed: Mar. 25, 2021

(65) Prior Publication Data
US 2021/0210374 A1 Jul. 8, 2021

Related U.S. Application Data

(63) Continuation of application No. 16/103,765, filed on Aug. 14, 2018, now Pat. No. 10,991,615.

(30) Foreign Application Priority Data

Aug. 16, 2017 (JP) .................... 2017-157146

(51) Int. Cl.
*H01L 21/687* (2006.01)
*B08B 3/08* (2006.01)
(Continued)

(52) U.S. Cl.
CPC .......... *H01L 21/68742* (2013.01); *B08B 3/08* (2013.01); *B24B 41/06* (2013.01);
(Continued)

(58) Field of Classification Search
CPC .............. H01L 21/30; H01L 21/68742; H01L 21/67051; H01L 21/6838; H01L 21/68735; B24B 41/06; B08B 3/08
See application file for complete search history.

(56) References Cited

U.S. PATENT DOCUMENTS 6,146,463 A * 11/2000 Yudovsky .............. H01L 21/68
118/728
6,231,716 B1 5/2001 White et al.
(Continued)

FOREIGN PATENT DOCUMENTS

JP 08-071511 A 3/1996
JP 2007-042924 A 2/2007
(Continued)

*Primary Examiner* — Tom Rodgers
(74) *Attorney, Agent, or Firm* — BakerHostetler

(57) ABSTRACT

To detach a substrate from a table without damaging the substrate. According to Embodiment 1, provided is a substrate processing apparatus including a table to hold a substrate, a plurality of lift pins that are arranged at periphery of the table and configured to arrange or separate the substrate on or from the table and to be movable in a direction perpendicular to a surface of the table, a drive mechanism that includes a motor to move the lift pins in the direction perpendicular to the surface of the table, and a control device that is configured to control the drive mechanism. The control device is configured to be capable of moving the lift pins at a first speed and at a second speed different from the first speed.

9 Claims, 9 Drawing Sheets

(51) Int. Cl.
    *B24B 41/06*     (2012.01)
    *H01L 21/00*     (2006.01)
    *H01L 21/30*     (2006.01)
    *H01L 21/67*     (2006.01)
    *H01L 21/683*     (2006.01)

(52) U.S. Cl.
    CPC .............. *H01L 21/00* (2013.01); *H01L 21/30* (2013.01); *H01L 21/67051* (2013.01); *H01L 21/6838* (2013.01); *H01L 21/68735* (2013.01)

(56) References Cited

U.S. PATENT DOCUMENTS

| | | |
|---|---|---|
| 6,456,480 B1 | 9/2002 | Hirose et al. |
| 7,038,706 B1 | 5/2006 | Hiyoshi |
| 7,083,706 B2 | 8/2006 | Kumekawa |
| 2007/0012339 A1 | 1/2007 | Fukuda et al. |
| 2008/0163899 A1 | 7/2008 | Takiguchi et al. |
| 2009/0194234 A1 | 8/2009 | Arai et al. |
| 2010/0024723 A1* | 2/2010 | Hasegawa ............... H01L 21/68 118/500 |
| 2016/0059380 A1* | 3/2016 | Yamaguchi ........... B24B 53/017 451/72 |
| 2017/0162409 A1 | 6/2017 | Toyomura et al. |

FOREIGN PATENT DOCUMENTS

| | | |
|---|---|---|
| JP | 2010-272709 A | 12/2010 |
| JP | 2017-107900 A | 6/2017 |

\* cited by examiner

SUBSTRATE PROCESSING APPARATUS AND METHOD FOR REMOVING SUBSTRATE FROM TABLE OF SUBSTRATE PROCESSING APPARATUS

TECHNICAL FIELD

The present invention relates to a substrate processing apparatus and a method for removing a substrate from a table of the substrate processing apparatus.

BACKGROUND ART

Chemical-mechanical polishing (CMP) apparatuses for polishing surfaces of substrates have been known in the fabrication of semiconductor devices. In a CMP apparatus, a polishing pad is pasted on the upper surface of a polishing table to form a polishing surface. The CMP apparatus presses a polishing target surface of a substrate held by a top ring against the polishing surface and rotates the polishing table and the top ring while supplying a slurry as polishing liquid to the polishing surface. Accordingly, the polishing surface and the polishing target surface are relatively moved with the surfaces being in sliding contact, and the polishing target surface is polished.

In a typical CMP apparatus, the polishing table or the polishing pad is larger than a substrate to be polished. While the substrate is held by the top ring such that a polishing target surface faces downward, the substrate is polished. The polished substrate is cleaned by a sponge member, such as of polyvinyl alcohol (PVA), rotating in contact with the substrate, and is then dried.

A known finishing process unit presses a contact member having a smaller diameter than a substrate against the polished substrate to move the contact member relative to the substrate (see Patent Literature 1, for example). Such a finishing process unit is provided in a CMP apparatus separately from a main polishing unit, and the substrate after primary polishing can be slightly and additionally polished and cleaned. In a finishing process unit, in order to bring a contact member into contact with a substrate at a high pressure and thereby to improve the cleaning effect and to increase the polishing speed, the substrate is required to be held by a table that is in contact with the entire back surface of the substrate. As one example, the table has a support surface in which a plurality of openings is formed in communication with a fluid passage connected to a vacuum source, and the substrate is vacuum-sucked onto the table through these openings. Alternatively, the substrate may be vacuum-sucked onto the table through a backing material made of elastic polyurethane foam, for example. In this case, the backing material is provided with through-holes at respective positions corresponding to the openings in the table.

For placing a substrate onto the table or detaching the substrate from the table, a plurality of extendable/retractable lift pins disposed along the outer periphery of the table may be used (see Patent Literature 2, for example). Specifically, the lift pins receive a substrate, which is conveyed by a conveyor robot, at a position above the support surface of the table, by supporting the lower surface of the substrate. Thereafter, the lift pins are lowered to a position below the support surface of the table. During the lowering of the lift pins, the substrate is placed onto the support surface of the table when the lift pins pass the table. After completion of processing on the table, the lift pins are raised from the lower end position to the upper end position. During the raising of the lift pins, when the lift pins pass the table, the lift pins abut against and support the lower surface of the substrate to lift the substrate. When the lift pins reach the upper position, the conveyor robot lifts up the substrate by picking up the substrate at the bottom, thereby delivering the substrate from the lift pins to the conveyor robot.

CITATION LIST

Patent Literature

PTL 1: Japanese Patent Laid-Open No. 8-71511
PTL 2: Japanese Patent Laid-Open No. 2017-107900

SUMMARY OF INVENTION

Technical Problem

In a case where the substrate arranged on the table by vacuum suction or the like is separated from the table using the lift pins, a drive mechanism for moving or extending/retracting the lift pins in a direction perpendicular to a flat surface of the substrate is provided. Such a drive mechanism can pneumatically drive a holding member to which the lift pins are fixed to move the lift pins (see Patent Literature 2). When the substrate is removed from the table, the vacuum suctioning of the substrate is released before the substrate is raised with the lift pins. However, even when the vacuum suctioning of the substrate is released, it is probable that the substrate hardly peels off from the surface of the table. In addition, in the case where the lift pins are pneumatically moved, the moving speed of the lift pins are high, and thus a large force is temporarily applied on the substrate upon raising the substrate sucked onto the table with the lift pins. As a result, the substrate may be damaged by warp or vibration of the substrate. Moreover, in this case, a large noise is generated when the substrate is separated from the table.

A substrate processing apparatus and a method for removing a substrate from a table of the substrate processing apparatus according to present disclosure alleviate or solve at least some of these problems.

Solution to Problem

Embodiment 1

According to Embodiment 1, provided is a substrate processing apparatus including a table configured to support a substrate, a plurality of lift pins that is arranged at periphery of the table and configured to arrange or separate the substrate on or from the table and to be movable in a direction perpendicular to a surface of the table, a drive mechanism that includes a motor to move the lift pins in the direction perpendicular to the surface of the table, and a control device that is configured to control the drive mechanism, in which the control device is configured to be capable of moving the lift pins at a first speed and at a second speed different from the first speed.

Embodiment 2

According to Embodiment 2, in the substrate processing apparatus according to Embodiment 1, the table includes an opening defined in its surface and a fluid passage communicating with the opening.

Embodiment 3

According to Embodiment 3, in the substrate processing apparatus according to Embodiment 2, the fluid passage is configured to be communicable with at least one of a pure water source, an air source, a nitrogen gas source, a chemical solution source, and a vacuum source.

Embodiment 4

According to Embodiment 4, the substrate processing apparatus according to Embodiment 1 or 2 includes a holding member for holding the lift pins and is configured such that the holding member is coupled to the drive mechanism and the lift pins are moved by moving the holding member.

Embodiment 5

According to Embodiment 5, in the substrate processing apparatus according to Embodiment 4, the holding member includes an opening and the table is arranged inside the opening of the holding member.

Embodiment 6

According to Embodiment 6, in the substrate processing apparatus according to any one of Embodiments 1 to 5, the table is arranged such that the surface thereof faces vertically upward.

Embodiment 7

According to Embodiment 7, the substrate processing apparatus according to any one of Embodiments 1 to 6 includes a liquid supply mechanism for supplying liquid to a surface of the substrate supported on the table.

Embodiment 8

According to Embodiment 8, provided is a method for removing a substrate held on a table from the table, the method including: a step of moving a plurality of lift pins toward the substrate to a first position at a first speed, the first position being a position where the plurality of lift pins make contact with the substrate, or a position where the plurality of lift pins are about to make contact with the substrate; and a step of moving the plurality of lift pins from the first position to a second position at a second speed, the second position being a position where the substrate is separated from the table, the second speed being slower than the first speed.

Embodiment 9

According to Embodiment 9, the method according to Embodiment 8 includes a step of moving the plurality of lift pins from the second position to a third position at a third speed, the third speed being faster than the second speed.

Embodiment 10

According to Embodiment 10, the method according to Embodiment 8 includes a step of supplying liquid toward the substrate from the table side in the second position.

Embodiment 11

According to Embodiment 11, the method according to Embodiment 9 includes a step of supplying liquid toward the substrate from the table side in the third position.

DESCRIPTION OF EMBODIMENTS

Hereinafter, exemplary embodiments of a substrate processing apparatus and a method for removing a substrate from a table of the substrate processing apparatus according to the present invention will be explained along with accompanying drawings. In the accompanying drawings, the same or similar symbols are attached to the same or similar components, and redundant explanation for the same or similar components may be omitted in the explanation of each embodiment. In addition, features shown in each embodiment can be applied to other embodiments, unless they conflict with each other.

Figure 1:
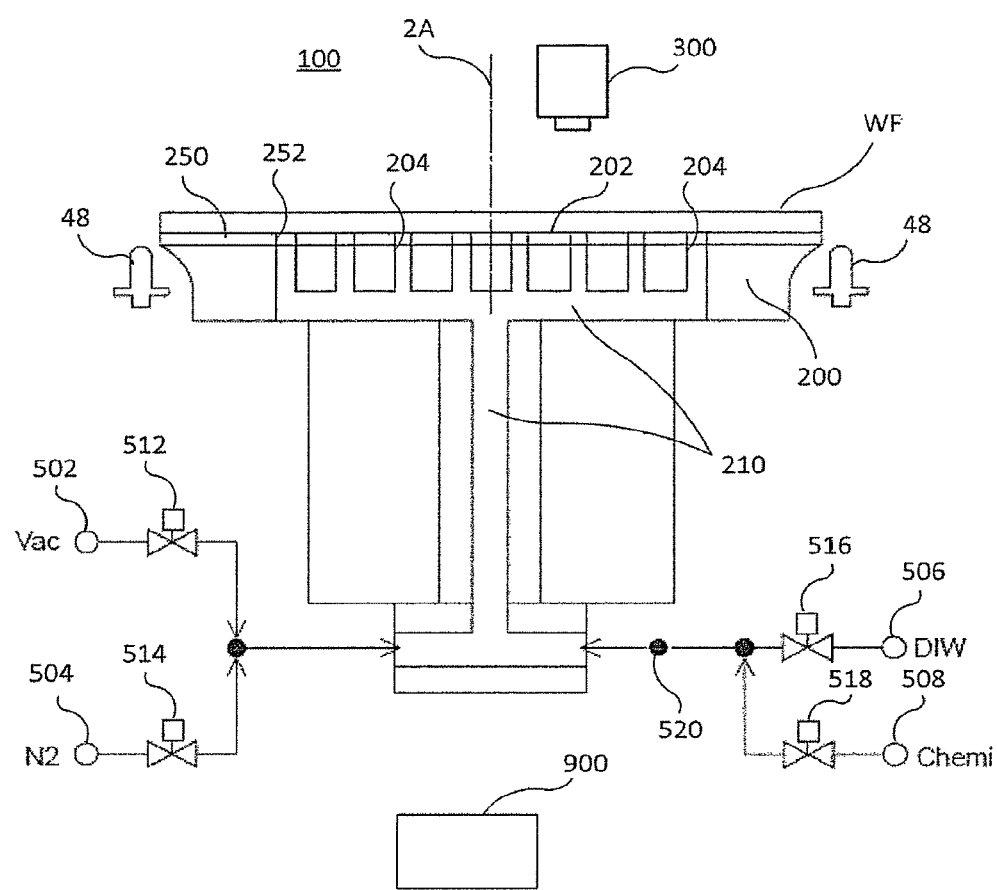
FIG. 1 is a schematic view of a substrate processing apparatus according to one embodiment, illustrating a table having a substrate WF placed thereon and peripheral parts thereof.

FIG. 1 is a schematic view of a substrate processing apparatus 100, illustrating a table 200 having a substrate WF placed thereon and peripheral parts thereof. The substrate processing apparatus 100 shown in FIG. 1 can be configured as a part or one unit of a CMP apparatus performing polishing process of substrates such as semiconductor wafers. As one example, the substrate processing apparatus 100 can be assembled to a substrate processing system including a polishing unit, cleaning unit, and conveyor mechanism for substrate and can be used for finishing process after primary polishing in the substrate processing system.

The table 200 includes a support surface 202 for supporting the substrate WF. The support surface 202 has openings 204 of a fluid passage 210 used to suck the substrate WF. The fluid passage 210 is connected to a vacuum source 502 and allows the substrate WF to be vacuum-sacked onto the support surface 202. The substrate WF may be sucked onto the table 200 via a backing material 250, as shown in FIG. 1. The backing material 250 may be formed of e.g., foamed polyurethane, which is elastic. Alternatively, the backing material 250 may be a silicone rubber. The backing material 250 serves as cushioning between the table 200 and the substrate WF, can prevent the substrate WF from being scratched, and alleviate adverse effects of the unevenness on the surface of the table 200 to the polishing process. The backing material 250 can be attached onto the surface of the table 200 by an adhesive tape. The backing material 250 may be a publicly known member. A member having through-holes 252 at respective positions corresponding to the openings 204 of the table 200 may be used.

Note that, in this specification, in the case where the substrate WF is mounted on the table 200 via the backing material 250, the surface of the backing material 250 in the state where this backing material 250 is attached serves as the "support surface" for supporting the substrate WF. In the case where the substrate WF is directly sucked onto the table 200 where the backing material 250 does not intervene, the surface of the table 200 serves as the "support surface" for supporting the substrate WF. Hereinafter, in the case of simply referring to "the support surface 202" or "the support surface 202 of the table 200", these terms include both the cases.

The table 200 further includes lift pins 48 as a conveyor mechanism associated with the table 200 to receive the substrate WF conveyed by a conveyor robot, not shown, and to place the substrate WF on the table 200. The multiple lift pins 48 are arranged along the outer periphery of the table 200. The lift pins 48 are movable in a direction perpendicular to the support surface 202 of the table 200. The lift pins 48 receive the substrate WF by supporting the outer peripheral portion of the substrate WF in a state where the lift pins 48 are projected to a position higher than the support surface 202, and subsequently, the lift pins 48 are retracted to a position lower than the support surface 202 to mount the substrate WF on the support surface 202 of the table 200. After completion of processing of the substrate WF on the table 200, the lift pins 48 move to the higher position to support the outer peripheral portion of the substrate WF and thus lift the substrate WF, and the conveyor robot picks up the substrate WF at the bottom. In this embodiment, the lift pins 48 move at various speeds at various positions, as will be described below.

The table 200 can be rotated about a rotation axis 2A by a drive mechanism, not shown.

As described above, the table 200 includes the fluid passage 210 to which a vacuum for allowing the substrate WF to be vacuum-sucked onto the support surface 202 is introduced. The fluid passage 210 may be further connected to a nitrogen source 504 used for detaching the substrate WF, a pure water supply source 506 and a chemical solution supply source 508 freely selectively used for cleaning the support surface 202 of the table 200. Also, during detaching the substrate WF from the table 200, the pure water may be supplied from the pure water supply source 506, or a mixture of pure water and nitrogen may be supplied. The piping for supplying a vacuum, pure water, a chemical solution, and nitrogen gas to the fluid passage 210 of the table 200 is provided with on-off valves 512, 514, 516, and 518. A vacuum, pure water, a chemical solution, and nitrogen gas can be supplied to the support surface 202 through the fluid passage 210 of the table 200 at any desired timing by controlling on-off of the on-off valves 512, 514, 516, and 518 using a control device 900. A pressure sensor 520 for measuring the pressure in the fluid passage 210 may be provided in the piping as shown in FIG. 1. Note that, the control device 900 is connected to various drive mechanisms, sensors, and the like of the substrate processing apparatus 100 and can control the operation of the substrate processing apparatus 100. The control device 900 may be configured by installing a predetermined program onto a typical computer that includes a memory device, a CPU, and an input/output mechanism.

In one embodiment, the substrate processing apparatus 100 may include a liquid supply nozzle 300 for supplying liquid to the support surface 202 of the table 200 and the substrate WF supported on the support surface 202. The liquid supply nozzle 300 can be configured to be connectable to the aforementioned pure water supply source 506, chemical solution supply source 508, and the like, or may be configured to be connectable to another liquid source. Supplying liquid from the liquid supply nozzle 300 enables performing cleaning of the substrate WF and the support surface 202 of the table 200.

Figure 2:
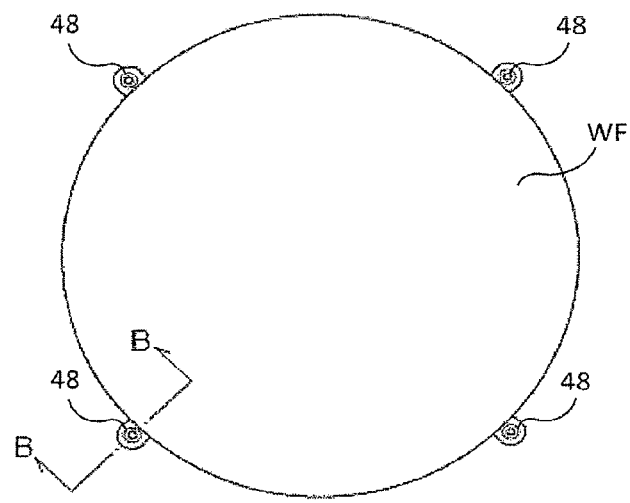
FIG. 2 is a top view illustrating the arrangement of a plurality of lift pins relative to the substrate WF, shown in FIG. 1.

FIG. 2 is a top view illustrating the arrangement of the plurality of lift pins 48 shown in FIG. 1, relative to the substrate WF. In FIG. 2, the substrate WF is placed on the support surface 202 of the table 200. As shown in FIG. 2, in this embodiment, a plurality (four in the illustrated example) of the lift pins 48 are arranged along the outer periphery of the substrate WF at equal intervals. Each of the lift pins 48 has a distal end portion including a substrate guide surface 48-1 capable of guiding the outer peripheral end surface of the substrate WF, and a proximal end portion including a substrate holding surface 48-2 extending from the substrate guide surface 48-1 outwardly in a radial direction of the lift pin 48 so that the substrate holding surface 48-2 is capable of abutting against the lower surface of the substrate WF (see FIG. 4A and so forth). The substrate guide surface 48-1 is a substantially cylindrical outer peripheral surface including a tapered portion 48-1a (see FIG. 4A and so forth). The lift pins 48 may be made of a carbon fiber reinforced PEEK (polyether ether ketone) resin, for example, so as to prevent electrification of the substrate WF.

Figure 3:
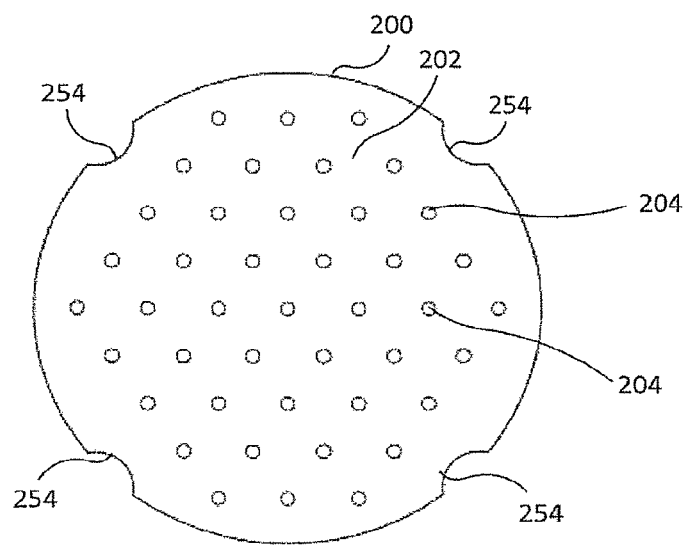
FIG. 3 is a top view illustrating a support surface of the table according to one embodiment.

FIG. 3 is a top view illustrating the support surface 202 of the table 200. As shown in FIG. 3, the support surface 202 is formed with a plurality of openings 204 (through-holes 252 communicating with the respective openings 204 when the backing material 250 is used). The plurality of openings 204 are communicated with the fluid passage 210 shown in FIG. 1, thereby allowing a vacuum to be introduced between the substrate WF and the support surface 202 through the fluid passage 210 during processing of the substrate WF.

Further, the outer periphery of the table 200 is formed with a plurality of arcuate cut-out portions 254 at respective positions corresponding to the lift pins 48. When the backing material 250 is used, similar cut-out portions are formed at respective positions of the backing material 250 corresponding to the cut-out portions 254 of the table 200. Each cut-out portion 254 is configured to be capable of receiving at least a part of the substrate holding surface 48-2 of the associated lift pin 48, thereby allowing the lift pin 48 to be raised and lowered relative to the table 200. It should be noted that the configuration of the cut-out portions 254 is not particularly limited, but any desired configuration may be used.

Note that, in this embodiment, the radius of the substrate WF and the radius of the table 200 are set substantially equal to each other. Accordingly, each cut-out portion 254 receives only the substrate holding surface 48-2 of the associated lift pin 48. However, the cut-out portion 254 may receive not only the substrate holding surface 48-2 but also the substrate guide surface 48-1 of the lift pin 48, depending on the radius of the substrate WF and the sizes of the cut-out portion 254 and the lift pin 48.

In this embodiment, the plurality of lift pins 48 are stepwisely movable between a processing position where each lift pin 48 is arranged entirely outside of the associated cut-out portion 254 of the table 200 so as not to interfere with the rotation of the table 200 during processing of a substrate, a detachment start position where the detachment of the substrate WF is started, a detachment complete position where the detachment of the substrate WF is complete, a cleaning position where the back surface of the substrate WF is cleaned, and a delivery position where the substrate WF is delivered to the conveyor robot. When the lift pins 48 move stepwisely between these positions, the moving speed of the lift pins 48 in each step can be individually set. FIGS. 4A to 4E are schematic sectional views taken along the line B-B in FIG. 2, showing the processing position (FIG. 4A), detachment start position (FIG. 4B), detachment complete position (FIG. 4C), cleaning position (FIG. 4D), and delivery position (FIG. 4E) respectively, of the lift pins 48.

Figure 4A:
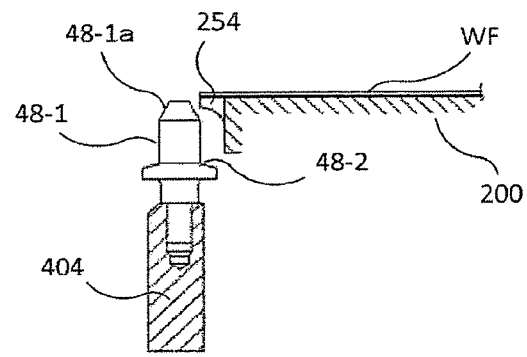
FIG. 4A is a schematic sectional view taken along the line B-B in FIG. 2, showing a state where the lift pins are in a processing position.

In the processing position, shown in FIG. 4A, no part of the lift pin 48 is present in the cut-out portion 254; therefore, the lift pin 48 does not interfere with the rotation of the table 200 during processing of the substrate WF. In the processing position, the fluid passage 210 of the table 200 is connected to the vacuum source 502, and the substrate WF is vacuum-sucked onto the support surface 202 of the table 200.

Figure 4B:
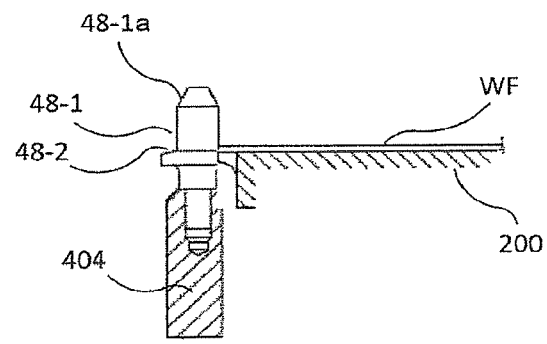
FIG. 4B is a schematic sectional view taken along the line B-B in FIG. 2, showing a state where the lift pins are in a detachment start position.

In the detachment start position, shown in FIG. 4B, the substrate guide surface 48-1 of the lift pin 48 extends to a position above the support surface 202 of the table 200, and the substrate holding surface 48-2 of the lift pin 48 is located in the cut-out portion 254 and is in slight contact with or is about to make contact with the substrate WF. In the detachment start position, the fluid passage 210 of the table 200 is connected to the pure water supply source 506 and/or the nitrogen source 504, and the substrate WF can be detached from the support surface 202 by supplying the substrate WF with pure water and/or nitrogen from the openings 204 of the table.

Figure 4C:
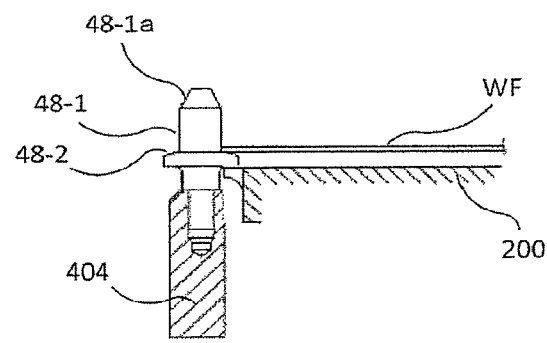
FIG. 4C is a schematic sectional view taken along the line B-B in FIG. 2, showing a state where the lift pins are in a detachment complete position.

The detachment completion position, shown in FIG. 4C, is a position where the substrate WF is raised by the lift pins 48, and the substrate WF is positioned completely away from the support surface 202 of the table 200. The detachment complete position may be a position where the substrate WF is separated from the support surface 202 by about several mm, for example, about 7 mm to 10 mm. As will be described below, the moving speed of the lift pins 48 between the detachment start position and the detachment complete position is set to be lower than that between other positions. The lift pins 48 are moved at a slow speed to separate the substrate WF from the support surface 202 slowly, thereby preventing the substrate WF from warping or being damaged.

Figure 4D:
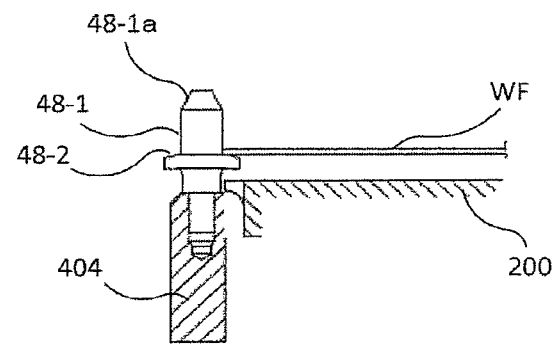
FIG. 4D is a schematic sectional view taken along the line B-B in FIG. 2, showing a state where the lift pins are in a cleaning position.

The cleaning position, shown in FIG. 4D, is a position where the back surface of the substrate WF is cleaned. In the cleaning position, it is possible to clean the back surface of the substrate WF by supplying the fluid passage 210 of the table 200 with the chemical solution, pure water, or the like to supply the back surface of the substrate WF with the chemical solution, pure water, or the like via the openings 204. Note that the cleaning position may be the same position as the detachment complete position. In addition, the cleaning position may not be provided if cleaning of the back surface of the substrate WF is not necessary.

Figure 4E:
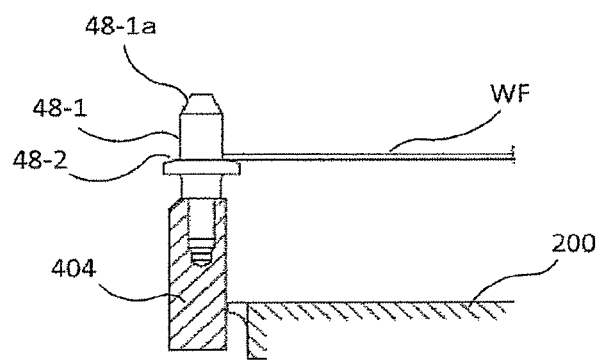
FIG. 4E is a schematic sectional view taken along the line B-B in FIG. 2, showing a state where the lift pins are in a delivery position.

The delivery position, shown in FIG. 4E, is a position where the substrate WF is delivered to the conveyor robot. Also, when receiving the substrate WF from the conveyor robot, the lift pins 48 receive the substrate WF at the delivery position. The lift pins 48 are held at the delivery position, shown in FIG. 4E, for a certain time both when the substrate WF is removed from the table 200 and when the substrate WF is arranged on the table.

Figure 5:
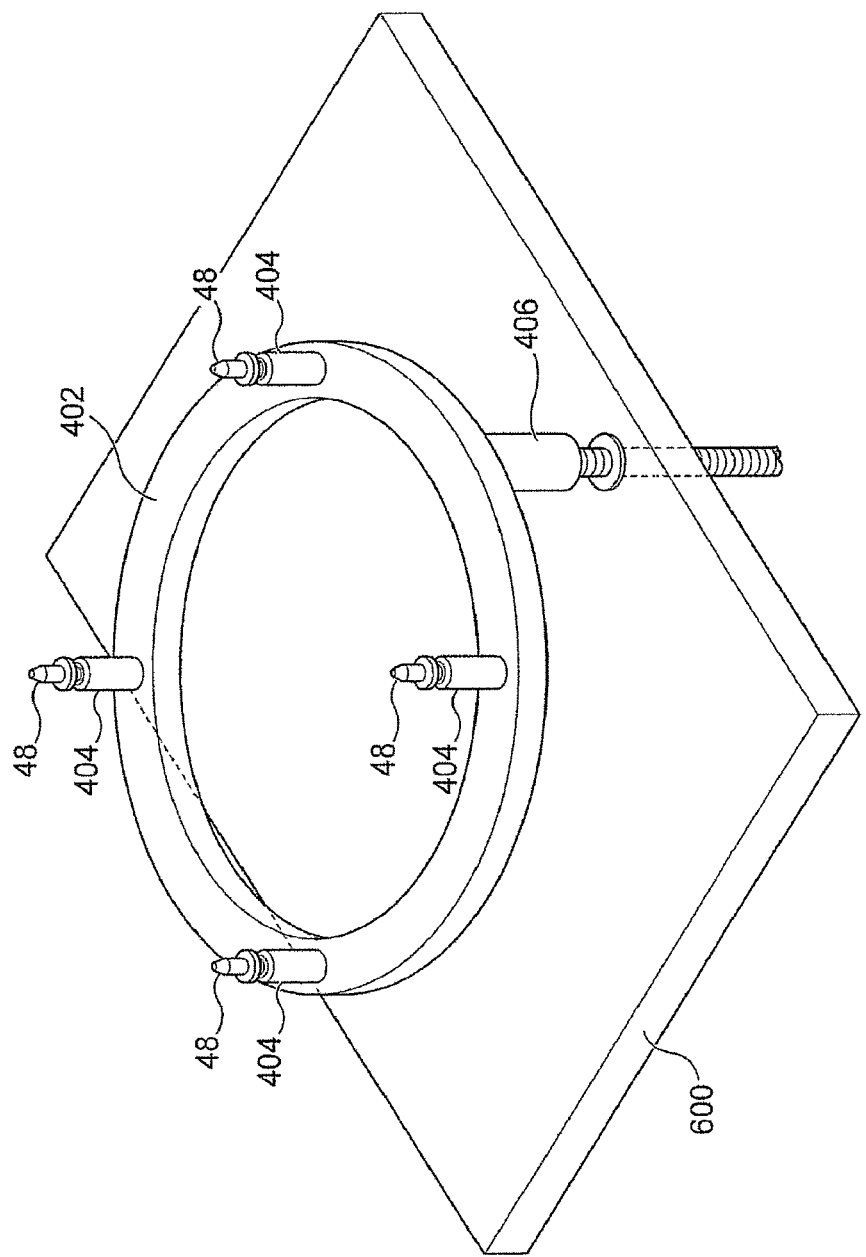
FIG. 5 is a perspective view schematically illustrating a drive mechanism according to one embodiment.

The substrate processing apparatus according to one embodiment includes a drive mechanism 400 for moving the lift pins 48. FIG. 5 is a perspective view schematically illustrating the drive mechanism 400. As shown in FIG. 5, the drive mechanism 400 includes a ring-shaped holding member 402. The ring-shaped holding member 402 has an inner space in which the table 200 is arranged. In addition, the table 200 is arranged on a base plate 600. Note that, the table 200 is not shown in FIG. 5 for graphic clarity. The holding member 402 is provided with fixing members 404 for fixing the respective lift pins 48. The lift pins 48 are fixed inside the respective fixing members 404 by screwing or the like. As described above, the lift pins 48 are disposed at positions corresponding to the positions of the respective cut-out portions 254 of the table 200.

The holding member 402 is coupled to a ball screw 406. The ball screw 406 extends downward through an opening formed in the base plate 600.

A motor 408 and a drive belt 410 for driving the ball screw 406 are arranged below the base plate 600. In the drive mechanism 400 according to the embodiment shown in FIG. 5, the holding member 402 is moved in a direction perpendicular to the support surface 202 of the table 200 by moving the ball screw 406, and thereby the lift pins 48 can be moved in the direction perpendicular to the support surface 202 of the table 200. In addition, in this embodiment, the motor 408 and the ball screw 406 are used as the drive mechanism 400, and thus it is possible to move the lift pins 48 at a desired speed by adjusting the rotational speed of the motor 408.

Figure 6:
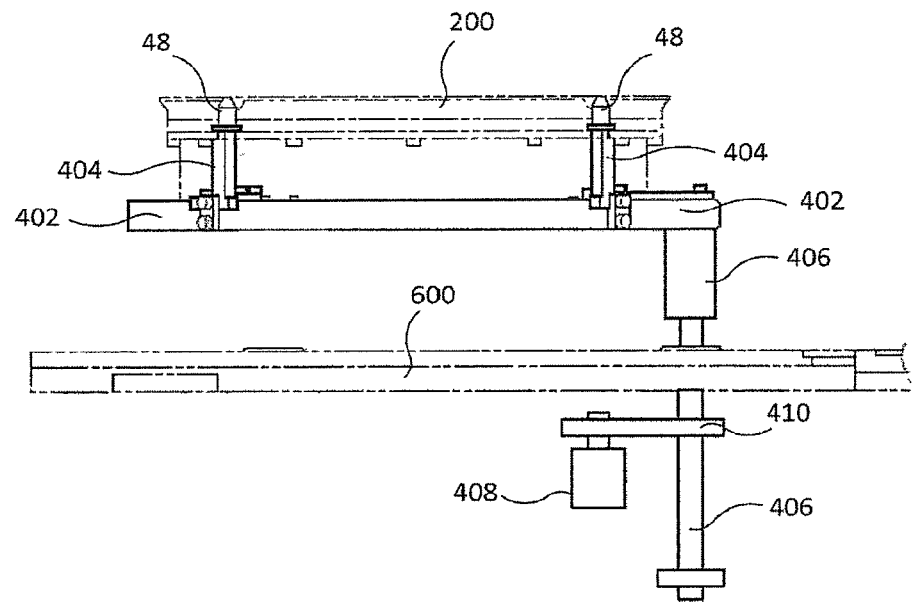
FIG. 6 is a side view of the drive mechanism shown in FIG. 5.
Figure 7:
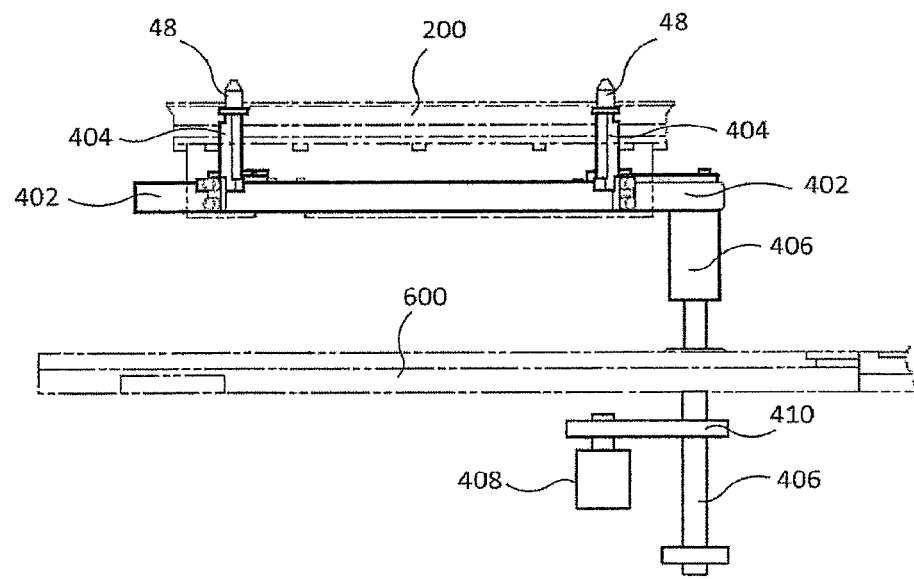
FIG. 7 is a side view of the drive mechanism shown in FIG. 5, showing a state where the lift pins are in the detachment start position.
Figure 8:
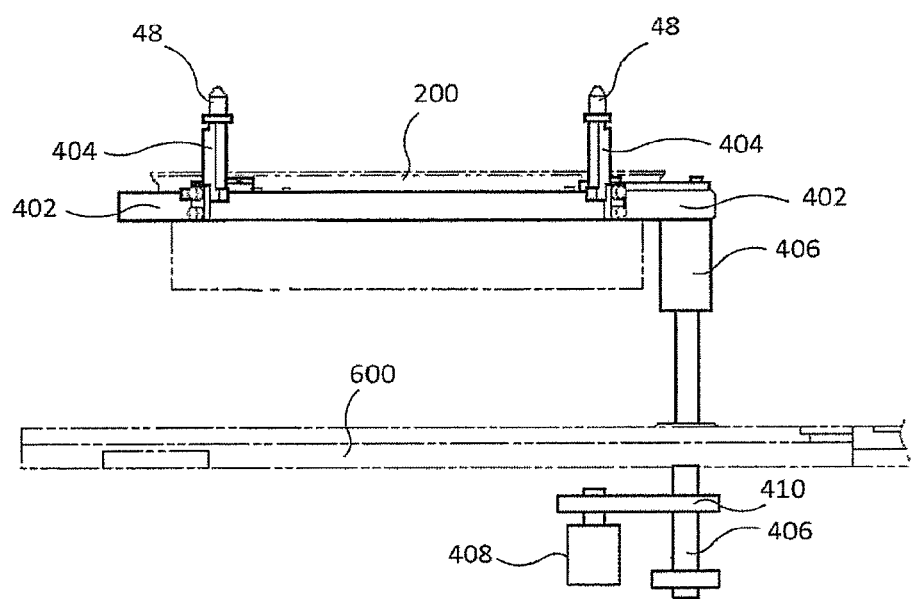
FIG. 8 is a side view of the drive mechanism shown in FIG. 5, showing a state where the lift pins are in the delivery position.

FIG. 6 is a side view of the drive mechanism 400 shown in FIG. 5. FIG. 6 shows a state where the lift pins 48 are in the processing position. In FIG. 6, the table 200 and the base plate 600 are shown by two-dot chain lines. FIG. 7 is a side view of the drive mechanism 400 shown in FIG. 5, showing a state where the lift pins 48 are in the detachment start position. FIG. 8 is a side view of the drive mechanism 400 shown in FIG. 5, showing a state where the lift pins 48 are in the delivery position.

Figure 9:
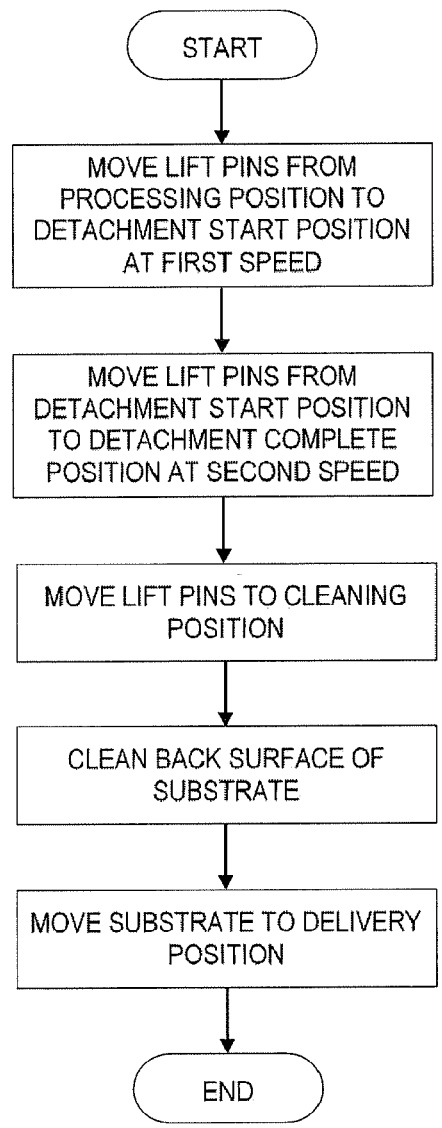
FIG. 9 is a flow chart illustrating a method for removing a substrate held on a table from the table according to one embodiment.

FIG. 9 is a flow chart illustrating a method for removing a substrate held on a table from the table according to one embodiment. The method can be performed using the substrate processing apparatus 100 according to the aforementioned embodiment. The flow chart of FIG. 9 starts when the substrate processing apparatus 100 has completed the processing such as polishing of the substrate WF. When the processing such as polishing is performed on the substrate WF, the lift pins 48 are in the processing position (see FIG. 4A and FIG. 6). When the processing of the substrate WF is complete, the lift pins 48 are moved from the processing position to the detachment start position at a first speed so as to remove the substrate WF from the table 200. The movement of the lift pins 48 can be performed by a drive mechanism that uses the motor 408 and the ball screw 406, as described above. Although the first speed may be set arbitrarily, it is preferable to move the lift pins 48 quickly in light of the overall processing speed of the substrate processing apparatus. The speed can be adjusted according to the rotational speed of the motor 408. As described above, in the detachment start position, supplying the substrate WF with the pure water and/or nitrogen from the openings 204 of the table 200 allows the substrate WF to be detached from the support surface 202.

Subsequently, the lift pins 48 are moved from the detachment start position to the detachment complete position at a second speed. It is preferable for the second speed to be a slow speed. Detaching slowly the substrate WF from the table 20 by the lift pins 48 prevents a large force from being exerted on the substrate, thereby preventing causing damage to the substrate WF. For example, the second speed may be set lower than the first speed. The movement of the lift pins 48 can be performed by the drive mechanism that uses the motor 408 and the ball screw 406, as described above. In this case, the speed can be adjusted according to the rotational speed of the motor 408.

After the lift pins 48 are slowly moved to the detachment position and the detachment of the substrate WF is performed, the lift pins 48 are moved to the cleaning position. The cleaning position may be a position that is separated from the table 200 by about several mm from the detachment complete position. Alternatively, the cleaning position may be the same position as the detachment complete position. In this case, the movement of the lift pins 48 from the detachment position to the cleaning position is dispensed with. Although the speed of the lift pins 48 when the lift pins 48 are moved to the cleaning position is set arbitrarily, it is preferable to move the lift pins 48 quickly. In the cleaning position, the back surface (surface on the table 200 side) of the substrate WF mounted on the lift pins 48 are cleaned. For example, in the substrate processing apparatus 100, the cleaning of the back surface of the substrate WF can be performed by supplying the fluid passage 210 with the pure water and/or chemical solution to supply the back surface of the substrate WF with the pure water and/or chemical solution from the openings 204 of the table 200. Note that, during cleaning of the back surface of the substrate WF, the front surface of the substrate WF may be supplied with the pure water and/or chemical solution from a liquid supply nozzle 30 as well. This is to prevent dirt and the processing liquid used in the processing of the substrate WF from reaching the front surface of the substrate WF due to the pure water and/or chemical solution supplied to the back surface of the substrate WF. The cleaning of the back surface of the substrate WF may not be performed if unnecessary.

Lastly, the lift pins 48 are moved from the cleaning position to the delivery position. Although the speed of the lift pins 48 when the lift pins 48 are moved to the delivery position is set arbitrarily, it is preferable to move the lift pins 48 quickly. In the delivery position, the conveyor robot, not shown, receives the substrate WF mounted on the lift pins 48. The conveyor robot thereafter conveys the substrate WF to another place.

Figure 10:
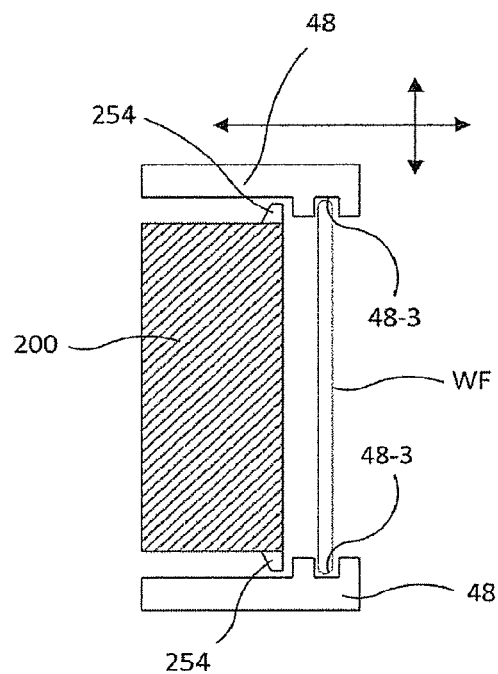
FIG. 10 is a side view illustrating a substrate processing apparatus according to one embodiment.

FIG. 10 is a side view illustrating the substrate processing apparatus 100 according to one embodiment. In FIG. 10, only configurations of the table 200 and the lift pins 48 are shown and configurations of other components are omitted. The configurations of other components may be the same as or different from the configurations of the embodiment shown in FIG. 1. In the substrate processing apparatus 100 according to the embodiment shown in FIG. 10, the normal direction of the support surface 202 of the table 200 faces the horizontal direction. In other words, the support surface 202 of the table 200 is parallel to the vertical direction. Each lift pin 48 shown in FIG. 10 includes a recess portion 48-3. The substrate processing apparatus 100 of FIG. 10 is configured to support the substrate WF with the recess portions 48-3 of the respective lift pins 48. The lift pins 48 of FIG. 10 can be moved in a direction perpendicular to the support surface 202 of the table 200 (see an arrow shown in FIG. 10) as with the previously described lift pins 48. In addition, each of the lift pins 48 of FIG. 10 is movable in a direction to be separated from one another (see an arrow shown in FIG. 10), that is, a direction parallel to the support surface 202 of the table 200. This is to hold the substrate WF in the recess portions 48-3 or to release the substrate WF.

Figure 11:
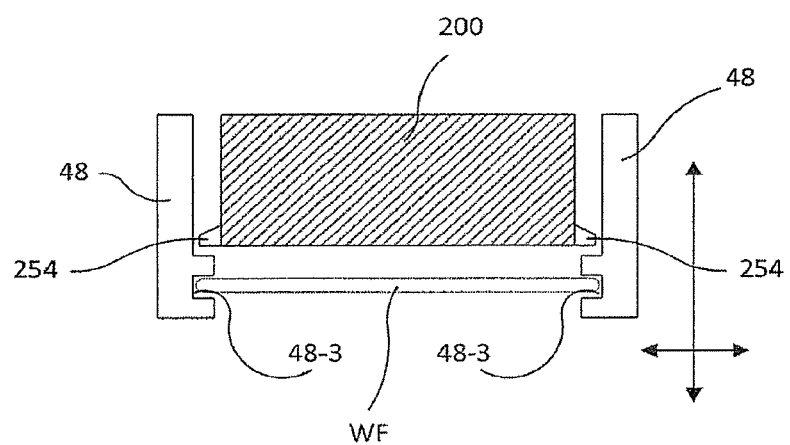
FIG. 11 is a side view illustrating a substrate processing apparatus according to one embodiment.

FIG. 11 is a side view illustrating the substrate processing apparatus 100 according to one embodiment. In FIG. 11, only the configurations of the table 200 and the lift pins 48 are shown, and configurations of other components are omitted but may be the same as or different from the configurations of the embodiment shown in FIG. 1. In the substrate processing apparatus 100 according to the embodiment shown in FIG. 11, the support surface 202 of the table 200 faces vertically downward. The lift pins 48 shown in FIG. 11 and the lift pins 48 shown in FIG. 10 may be different only in the orientations and have the same configuration.

In addition to the embodiments shown in FIGS. 10 and 11, the substrate processing apparatus 100 may have the same configuration and be configured such that the support surface 202 of the table 200 faces an arbitrary direction.

Although an embodiment of the present invention has been described above based on specific examples, the embodiment described above is intended to facilitate understanding of the present invention and is not meant to limit the present invention. The present invention can be modified and improved without departing from the spirit and scope of the present invention. Needless to say, the present invention includes equivalents thereof. Also, the components described in the appended claims and in the specification may be used in any combination or any of the components may be omitted as long as at least some of the problems described above can be solved or as long as at least some of the advantageous effects described above can be achieved.

REFERENCE SIGNS LIST

48 lift pin
100 substrate processing apparatus
200 table
202 support surface
204 opening
210 fluid passage
250 backing material
252 through-hole
254 cut-out portion
300 liquid supply nozzle
400 drive mechanism
402 holding member 404 fixing member
406 ball screw
408 motor
410 drive belt
502 vacuum source
504 nitrogen source
506 pure water supply source
508 chemical solution supply source
600 base plate
900 control device
WF substrate

What is claimed is:

1. A polishing apparatus comprising:
a table configured to support a substrate;
a plurality of lift pins arranged at a periphery of the table, the lift pins configured to arrange or remove the substrate on or from the table and to be movable in a direction perpendicular to a surface of the table, the lift pins configured to support the substrate by engaging an outer peripheral portion of the substrate;
a drive mechanism including a motor to move the lift pins in a direction perpendicular to the surface of the table;
and a control device configured to control the drive mechanism,
wherein the control device is configured to be capable of moving the lift pins at a first speed and at a second speed different from the first speed,
wherein each of the lift pins includes: a substrate guide surface extending perpendicular to the surface of the table; and substrate holding surface extending from the substrate guide surface outwardly in a radial direction; and
wherein the substrate guide surfaces of the lift pins are configured to face an outermost peripheral edge of the substrate, and the substrate holding surfaces of the lift pins are configured to support the outer peripheral portion of the substrate,
wherein the polishing apparatus further comprises a base plate on which the table is arranged,
wherein the drive mechanism further includes:
a holding member for holding the lift pins;
a ball screw to which the holding member is coupled, and
a drive belt for driving the ball screw,
wherein the holding member is coupled to the ball screw and the lift pins are moved by moving the holding member,
the ball screw extends downward through an opening formed in the base plate,
the motor and the drive belt are arranged below the base plate.

2. The polishing apparatus according to claim 1, wherein the table includes:
an opening defined in its surface; and
a fluid passage communicating with the opening.

3. The polishing apparatus according to claim 2, wherein the fluid passage is configured to be capable of coupling to at least one of a pure water source, an air source, a nitrogen gas source, a chemical solution source, and a vacuum source.

4. The polishing apparatus according to claim 1, wherein the holding member has an opening and the table is arranged inside the opening of the holding member.

5. The polishing apparatus according to claim 1, wherein the table is arranged such that the surface thereof faces vertically upward.

6. The polishing apparatus according to claim 1, further comprising a liquid supply mechanism for supplying liquid to a surface of the substrate supported on the table.

7. The polishing apparatus according to claim 1, wherein the control device is configured to move the lift pins toward the substrate to a first position at the first speed, the first position being a position where the plurality of lift pins make contact with an outer peripheral portion of the substrate, or a position where the plurality of lift pins is about to make contact with the outer peripheral portion of the substrate;
the control device is configured to detach the substrate, which has been vacuum-sucked onto the table, from the table when the lift pins are at the first position;
the control device is configured to move the lift pins from the first position to a second position at the second speed, the second position being a position where the substrate is separated from the table with the outer peripheral portion of the substrate being supported by the plurality of lift pins; and
the second speed is slower than the first speed.

8. A method for removing a substrate supported on a table from the table, the table configured to support a substrate, the table comprising: a plurality of lift pins arranged at a periphery of the table, the lift pins configured to arrange or remove the substrate on or from the table and to be movable in a direction perpendicular to a surface of the table, the lift pins configured to support the substrate by engaging an outer peripheral portion of the substrate, a drive mechanism including a motor to move the lift pins in a direction perpendicular to the surface of the table, and a control device configured to control the drive mechanism, wherein the control device is configured to be capable of moving the lift pins at a first speed and at a second speed different from the first speed, wherein each of the lift pins includes: a substrate guide surface extending perpendicular to the surface of the table, and substrate holding surface extending from the substrate guide surface outwardly in a radial direction, and wherein the substrate guide surfaces of the lift pins is configured to face an outermost peripheral edge of the substrate, and the substrate holding surfaces of the lift pins is configured to support the outer peripheral portion of the substrate, the method, comprising:
a step of moving a plurality of lift pins toward the substrate to a first position at a first speed, the first position being a position where the plurality of lift pins make contact with the substrate, or a position where the plurality of lift pins is about to make contact with the substrate; and
a step of moving the plurality of lift pins from the first position to a second position at a second speed, the second position being a position where the substrate is separated from the table, the second speed being slower than the first speed, wherein a support surface of the table faces a horizontal direction;
the step of moving the plurality of lift pins toward the substrate to the first position at the first speed includes a step of moving the plurality of lift pins in vertical direction for holding the substrate;
the step of moving the plurality of lift pins from the first position to the second position at the second speed includes a step of moving the plurality of lift pins in horizontal direction.

9. The method according to claim 8, further comprising a step of supplying liquid toward the substrate from an opposite side in the second position.

* * * * *